(12) United States Patent
Blaum et al.

(10) Patent No.: US 9,058,291 B2
(45) Date of Patent: Jun. 16, 2015

(54) MULTIPLE ERASURE CORRECTING CODES FOR STORAGE ARRAYS

(75) Inventors: Mario Blaum, San Jose, CA (US);
James L. Hafner, San Jose, CA (US);
Steven R. Hetzler, Los Altos, CA (US);
Daniel F. Smith, Felton, CA (US)

(73) Assignee: International Business Machines Corporation, Armonk, NY (US)

( * ) Notice: Subject to any disclaimer, the term of this patent is extended or adjusted under 35 U.S.C. 154(b) by 185 days.

(21) Appl. No.: 13/036,817

(22) Filed: Feb. 28, 2011

(65) Prior Publication Data

US 2012/0221920 A1    Aug. 30, 2012

(51) Int. Cl.
G11C 29/00  (2006.01)
G06F 11/10  (2006.01)
G11C 29/04  (2006.01)

(52) U.S. Cl.
CPC ...... *G06F 11/108* (2013.01); *G11C 2029/0411* (2013.01)

(58) Field of Classification Search
CPC ........................... H03M 13/373; H04L 1/0063
USPC ........................................... 714/5, 770
See application file for complete search history.

(56) References Cited

U.S. PATENT DOCUMENTS

| | | | |
|---|---|---|---|
| 4,379,259 A | | 4/1983 | Varadi et al. |
| 4,719,628 A | | 1/1988 | Ozaki et al. |
| 5,038,350 A | | 8/1991 | Mester |
| 5,164,944 A | | 11/1992 | Benton et al. |
| 5,367,652 A | | 11/1994 | Golden et al. |
| 5,499,253 A | | 3/1996 | Lary |
| 5,751,730 A | * | 5/1998 | Mourot ..................... 714/755 |
| 5,862,158 A | * | 1/1999 | Baylor et al. ............. 714/800 |

(Continued)

FOREIGN PATENT DOCUMENTS

| CN | 1808374 A | 7/2006 |
|---|---|---|
| CN | 101183323 A | 5/2008 |

(Continued)

OTHER PUBLICATIONS

Chih-Shing Tau et al.; "Efficient Parity Placement Schemes for Tolerating Triple Disk Failures in RAID Architectures"; Proceedings of the17th International Conference on Advanced Information Networking and Applications (AINA•03) 0-7695-Downloaded on May 4, 2010 at 17:41:18 UTC from IEEE Xplore.

(Continued)

*Primary Examiner* — M. Mujtaba K Chaudry
(74) *Attorney, Agent, or Firm* — Cantor Colburn LLP; Yusuke Kanehira (57) ABSTRACT

Embodiments of the invention relate to erasure correcting codes for storage arrays. An aspect of the invention includes receiving a read stripe from a plurality of storage devices. The read stripe includes a block of pages arranged in rows and columns, with each column corresponding to one of the storage devices. The pages include data pages and parity pages, with the number of parity pages at least one more than the number of rows and not a multiple of the number of rows. The method further includes reconstructing at least one erased page in response to determining that the read stripe includes the at least one erased page and that the number of erased pages is less than or equal to the number of parity pages. The reconstructing is responsive to a multiple erasure correcting code and to the block of pages. The reconstructing results in a recovered read stripe.

16 Claims, 4 Drawing Sheets

|  | Col 0 | Col 1 | Col 2 | Col 3 | Col 4 |
|---|---|---|---|---|---|
| Row 0 | $d_{00}$ | $d_{01}$ | $d_{02}$ | $d_{03}$ | $p_{04}$ |
| Row 1 | $d_{10}$ | $d_{11}$ | $d_{12}$ | $d_{13}$ | $p_{14}$ |
| Row 2 | $d_{20}$ | $d_{21}$ | $d_{22}$ | $p_{23}$ | $p_{24}$ |

(56) References Cited

U.S. PATENT DOCUMENTS

| | | | |
|---|---|---|---|
| 6,138,125 A | 10/2000 | DeMoss | |
| 6,141,770 A | 10/2000 | Fuchs et al. | |
| 6,851,082 B1 * | 2/2005 | Corbett | 714/770 |
| 6,973,613 B2 | 12/2005 | Cypher | |
| 7,062,604 B1 | 6/2006 | Nanda | |
| 7,073,115 B2 | 7/2006 | English et al. | |
| 7,093,159 B1 | 8/2006 | Nanda | |
| 7,254,754 B2 | 8/2007 | Hetzler et al. | |
| 7,350,126 B2 | 3/2008 | Winograd et al. | |
| 7,536,627 B2 | 5/2009 | Gross et al. | |
| 7,644,348 B2 | 1/2010 | Longwell et al. | |
| 7,681,104 B1 | 3/2010 | Sim-Tang et al. | |
| 7,747,898 B1 | 6/2010 | Shaw et al. | |
| 8,117,519 B2 | 2/2012 | Ito et al. | |
| 2005/0278568 A1 | 12/2005 | Delaney | |
| 2006/0074995 A1 | 4/2006 | Hafner et al. | |
| 2006/0129873 A1 * | 6/2006 | Hafner | 714/5 |
| 2009/0006923 A1 | 1/2009 | Gara et al. | |
| 2009/0013233 A1 | 1/2009 | Radke | |
| 2010/0115335 A1 | 5/2010 | Wylie et al. | |
| 2010/0332730 A1 | 12/2010 | Royer, Jr. et al. | |
| 2011/0041005 A1 | 2/2011 | Selinger | |
| 2011/0041039 A1 | 2/2011 | Harari et al. | |
| 2011/0060864 A1 | 3/2011 | Yoshii et al. | |

FOREIGN PATENT DOCUMENTS

| | | |
|---|---|---|
| WO | WO0161491 A1 | 8/2001 |
| WO | 0208900 A2 | 1/2002 |
| WO | WO2004040450 A1 | 5/2004 |

OTHER PUBLICATIONS

Chong-Won Park et al.; "A Multiple Disk Failure Recovery Scheme in RAID Systems" Journal of Systems Architecture 50 (2004) 169-175.

Haruhiko Kaneko et al.; "Three Level Error Control Coding for Dependable Solid State Drives"; Downloaded on May 4, 2010 at 17:21:31 UTC from IEEE Xplore. Restrictions apply. 2008 14th IEEE Pacific Rim International Symposium on Dependable Computing; pp. 1-8.

Jehan-Francois Paris et al.; Using Storage Class Memories to Increase the Reliability of Two-Dimensional RAID Arrays; Downloaded on May 4, 2010 at 15:50:45 UTC from IEEE Xplore.

Kwanghee Park et al.; Reliability and Performance Enhancement Technique for SSD Array Storage System using RAID Mechanism; Downloaded on May 4, 2010 from IEEE Xplore; pp. 140-146.

Nam-Kyu Lee et al.; "Efficient Parity Placement Schemes for Tolerating up to Two Disk Failures in Disk Arrays"; Journal of Systems Architecture 46 (2000) 1383-1402.

International Search Report & Written Opinion for PCT/IB2012/050605 dated Jul. 12, 2012, 9 pages.

PCT International Search Report and Written Opinion; International Application No. PCT/IB2013/050262; International Filing Date: Jan. 11, 2013; Date of Mailing: Jun. 20, 2013, pp. 1-10.

Blaum et al., "On Lowest Density MDS Codes," Information Theory, IEEE Transactions on, vol. 45, No. 1, pp. 46-59, Jan. 1999.

Elerath, John G., et al.; "Enhanced Reliability Modeling of RAID Stoarge Systems"; pp. 1-10; 37th Annual IEEE/IFIP International Conference on Dependable Systems and Networks (DSN '07) 2007.

Jing et al., "A Fast Error and Erasure Correction Algorithm for a Simple RS-RAID," Info-tech and Info-net, 2001, Proceedings, ICII 2001—Beijing, 2001 Internation Conferences on, vol. 3, pp. 333-338.

Disclosed Anonymously, "Method for Preventing Catastrophic Failures in RAID Volumes using Dynamic Reconfiguration", IPCOM000125746D, IP.com electronic publication: Jun. 15, 2005, 6 pages.

Kerrigan, M. et al., "Error Correction Procedure to Correct One Hard and One Soft Error Using a Single Error Correcting Code", IPCOM000047387D, original publication date: Nov. 1, 1983, IP.com electronic publication date: Feb. 7, 2005, 4 pages.

U.S. Appl. No. 13/563,123; Non-Final Office Action; filed Jul. 31, 2012; Date Mailed: May 5, 2014; pp. 1-22.

* cited by examiner

|  | Col 0 | Col 1 | Col 2 | Col 3 | Col 4 |
|---|---|---|---|---|---|
| Row 0 | $d_{00}$ | $d_{01}$ | $d_{02}$ | $d_{03}$ | $p_{04}$ |
| Row 1 | $d_{10}$ | $d_{11}$ | $d_{12}$ | $d_{13}$ | $p_{14}$ |
| Row 2 | $d_{20}$ | $d_{21}$ | $d_{22}$ | $p_{23}$ | $p_{24}$ |

MULTIPLE ERASURE CORRECTING CODES FOR STORAGE ARRAYS

BACKGROUND

The present invention relates generally to storage systems, and more specifically, to erasure correcting codes for storage arrays.

Computer systems utilize data redundancy schemes such as parity computation to protect against loss of data on a storage device. In redundant array of independent disk (RAID) systems, data values and related parity values are striped across disk drives. RAID systems are typically used to protect information stored in hard disk drive (HDD) arrays from catastrophic disk failures. Two popular RAID schemes are RAID 5 which protects against a single catastrophic disk failure and RAID 6 which protects against a double catastrophic disk failure.

Flash devices are a type of non-volatile storage devices that can be electrically erased and reprogrammed in large blocks. Like HDDs, flash devices divide the medium into sectors that are typically 512 bytes. Flash devices further collect sectors into pages with typically eight sectors per page, so that each page contains four thousand or 4 kilo (K) bytes. Each sector is protected by an error correcting code (ECC) that corrects a number of single bit errors. A popular choice is a Bose-Chaudhuri-Hocquenghem (BCH) code, like an eight bit correcting or fifteen bit correcting BCH code, although many variations are possible. As in HDDs, pages in flash devices may suffer hard errors (HEs). This occurs, for example, when the error correcting capability of the BCH code is exceeded. As compared to HDDs, exceeding the capability of the BCH code is more likely in flash devices, both as a page nears the end of its write endurance lifetime, or as a page nears the end of its data retention lifetime. Thus, the number of HEs in flash devices may be expected to grow over time, leaving latent HEs on a device.

An array made up of flash devices may encounter a mix of catastrophic device failures combined with possibly more prevalent HEs. For example, use of RAID 5 for protecting information stored in flash devices may result in a device failure when there are latent HEs. Therefore, if a device in a RAID 5 system experiences a catastrophic device failure, and some other device has a HE in a page, the row where such an event occurs will be unable to retrieve the information. RAID 6 requires dedicating an entire second device for parity, which is expensive when the predominant failures are HEs.

BRIEF SUMMARY

An embodiment is a method for correcting erasures in a storage array. The method includes receiving a read stripe from a plurality of storage devices. The read stripe includes a block of pages arranged in rows and columns with each column corresponding to one of the storage devices. The pages include data pages and parity pages, with the number of parity pages at least one more than the number of rows and not a multiple of the number of rows. The method further includes determining whether the read stripe includes at least one erased page and whether the number of erased pages is less than or equal to the number of parity pages. The at least one erased page is reconstructed in response to determining that the read stripe includes at least one erased page and that the number of erased pages is less than or equal to the number of parity pages. The reconstructing is responsive to a multiple erasure correcting code and to the block of pages. The reconstructing results in a recovered read stripe.

Another embodiment is a system for correcting erasures in a storage array. The system includes an array controller and a storage array that includes a plurality of storage devices. The array controller is configured for receiving a read stripe from a plurality of storage devices. The read stripe includes a block of pages arranged in rows and columns with each column corresponding to one of the storage devices. The pages include data pages and parity pages, with the number of parity pages at least one more than the number of rows and not a multiple of the number of rows. The array controller is further configured for determining whether the read stripe includes at least one erased page and whether the number of erased pages is less than or equal to the number of parity pages. The at least one erased page is reconstructed in response to determining that the read stripe includes at least one erased page and that the number of erased pages is less than or equal to the number of parity pages. The reconstructing is responsive to a multiple erasure correcting code and to the block of pages. The reconstructing results in a recovered read stripe.

A further embodiment is a computer program product for correcting erasures in a storage array. The computer program product includes a computer readable storage medium having computer readable program code embodied therewith. The computer readable program code includes computer readable program code that is configured to receive a read stripe from a plurality of storage devices. The read stripe includes a block of pages arranged in rows and columns with each column corresponding to one of the storage devices. The pages include data pages and parity pages, with the number of parity pages at least one more than the number of rows and not a multiple of the number of rows. The computer readable program code is further configured to determine whether the read stripe includes at least one erased page and whether the number of erased pages is less than or equal to the number of parity pages. The at least one erased page is reconstructed in response to determining that the read stripe includes at least one erased page and that the number of erased pages is less than or equal to the number of parity pages. The reconstructing is responsive to a multiple erasure correcting code and to the block of pages. The reconstructing results in a recovered read stripe.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

An embodiment utilizes a multiple erasure correcting code for protecting against data loss occurring as a combination of a device failure and a block failure in a storage system. In the case where a single device fails, an embodiment described herein provides protection comparable to RAID 6, but with storage efficiency approaching that of RAID 5.

As used herein, the term "erasure correction" refers to correcting an error whose location is known. An erasure correction is different than an "error correction" which, as used herein, refers to correcting an error whose location is not known. Correcting erasures requires about half of the amount of redundancy that is required to correct errors. As used herein, the term "hard error" or "HE" refers to an erasure (i.e., an error with a known location).

While error correcting codes (ECCs), such as the Bose-Chaudhuri-Hocquenghem (BCH) code, help reduce a raw bit error rate, "p", in a flash device to a lower level after correction, the final level may still be higher than a target raw bit error rate for the storage system. For example, a fifteen bit correcting BCH code may bring down a raw bit error rate of p=0.001 to a raw bit error rate of $2.7e^{-9}$ after decoding a 512 byte (B) sector. However, this raw bit error rate, which represents the probability of a HE in a flash device, is substantially higher than that of typical hard disk drive (HDD), which may range from $8e^{-14}$ to $8e^{-16}$. Higher error rates are likely to occur near the end of write endurance as well as near the end of the data retention life in a flash device.

When the error correcting capability of an ECC is exceeded, this event will be detected with a very high probability. For example, if a fifteen bit correction BCH code has been implemented and more than fifteen errors have occurred, it is very likely that the BCH code itself will detect such an event. In any case, a cyclical redundancy code (CRC) is generally added in order to assure that the probability of miscorrection is of the order of $1e^{-26}$ or so. A BCH code failing to detect a miscorrection is symptomatically equivalent to an HDD dropped write or off-track write.

Any multiple erasure correcting code known in the art may be utilized by an embodiment. One example of a multiple erasure code utilized by an embodiment is a Reed-Solomon (RS) code. RS codes are well known in the art and can be used to correct a plurality of erasures. RS codes are based on symbols, with the size of the symbols depending on the application. For a tutorial on RS codes that is relevant to RAID architectures, see J. S. Plank "A Tutorial on Reed-Solomon Coding for Fault-Tolerance in RAID-like Systems", *Software, Practice & Experience*, 995-1012, September 1997.

Another family of efficient codes for correction of a plurality of erasures is given by the Blaum-Roth 93 (BR93) codes, as described in M. Blaum et al., New Array Codes for Multiple Phased Burst Correction", IEEE Transactions on Information Theory, vol. 39, pp. 66-77 1993. BR93 codes are array codes that tend to be less complex than RS codes by avoiding Galois field operations and doing only exclusive-or (XOR) operations instead.

Both the RS and BR93 codes are maximum distance separable (MDS) codes, meaning that they make optimal use of the redundancy in order to correct erasures. RS and BR93 codes are examples of two types of multiple erasure correcting codes that may be utilized by embodiments described herein. Embodiments are not limited to these two codes as other families of codes may also be implemented such as a generalized EVENODD code or a generalized row diagonal code.

Figure 1:
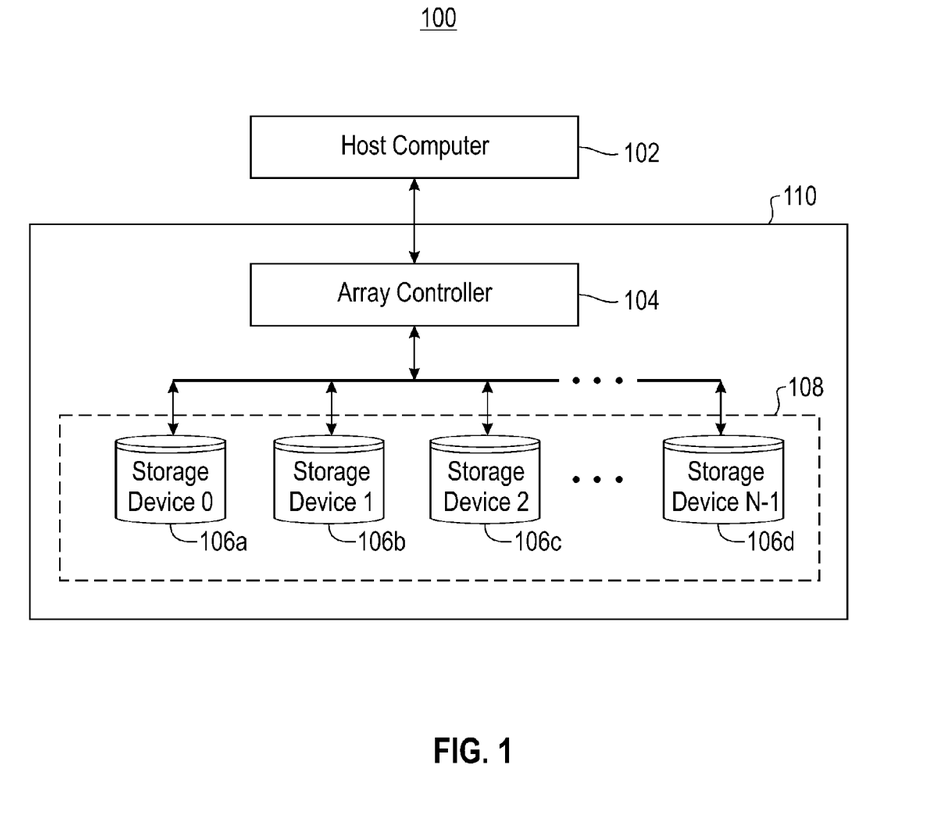
FIG. 1 illustrates a block diagram of a system for providing multiple erasure correcting codes in accordance with an embodiment.

FIG. 1 illustrates a block diagram of a system 100 for providing multiple erasure correcting codes in accordance with an embodiment. As shown in FIG. 1, a host computer 102 is in communication with an array controller 104 in a storage system 110. The storage system 110 stores data in a storage array 108 made up of N storage devices 106 (where N is greater than one): storage device zero 106a, storage device one 106b, storage device two 106c, through storage device N−1 106d. In an embodiment, parity bits are stored in the storage devices 106 along with host data (e.g., represented as data bits). In an embodiment, the storage devices 106 in the storage array 108 are implemented by flash devices. In an embodiment, the array is made up of five flash devices, each device having a 32 Gigabyte (G) storage capacity.

As shown in FIG. 1, the array controller 104 is part of the storage system 110; in another embodiment, the array controller 104 is part of the host computer 102.

Figure 2:
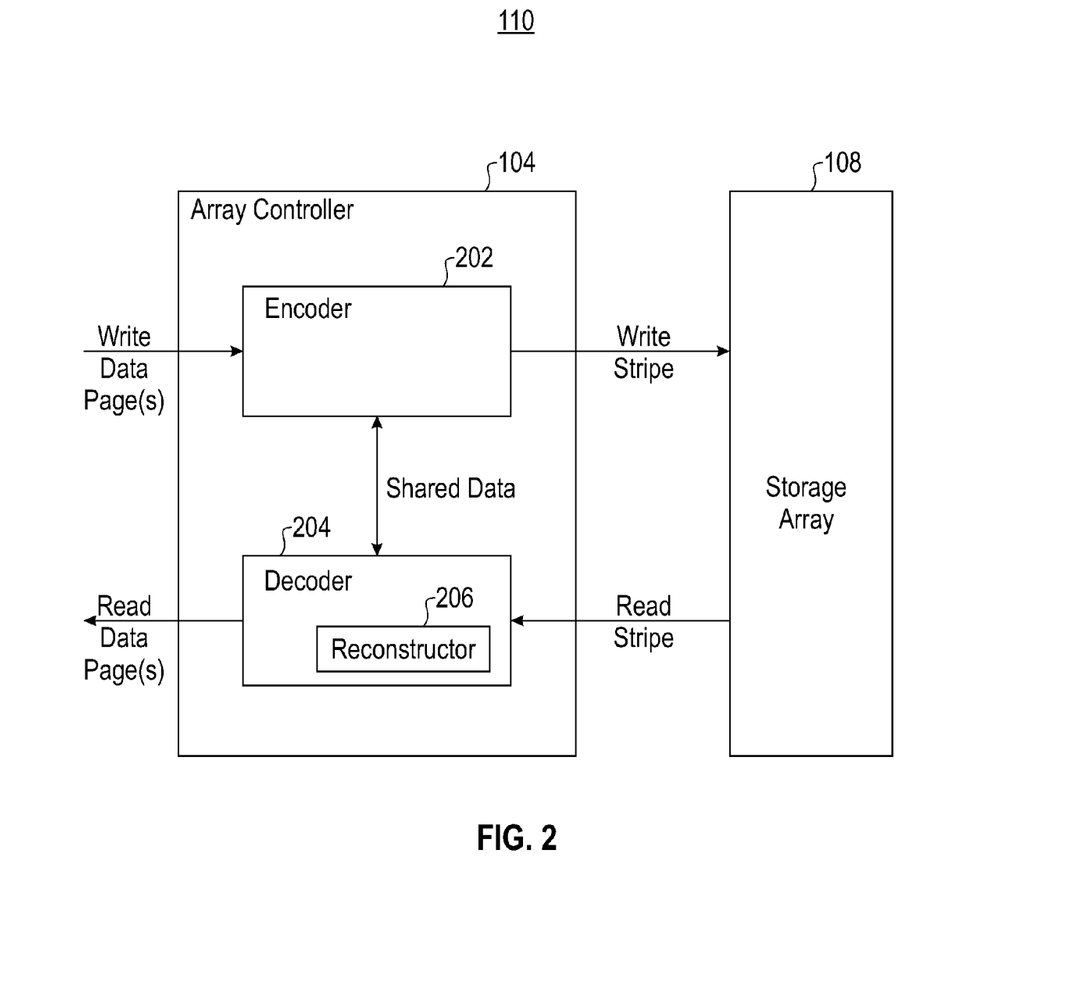
FIG. 2 illustrates a storage system in accordance with an embodiment.

FIG. 2 illustrates the storage system 110 of FIG. 1 in accordance with an embodiment. The storage system 110 may include numerous other elements such as receivers, transmitters, and clocks as known by those of ordinary skill in the art, which are not illustrated for purposes of clarity. As shown in FIG. 2, the array controller 104 includes an encoder 202 and a decoder 204. The encoder 202 is utilized during a write process for receiving one or more write data pages (e.g., from the host computer 102) and generating a write stripe, which includes both data pages and parity pages. In an embodiment, the write stripe is written in the storage array 108 and spans a plurality of rows in the storage array 108. The decoder 204 is utilized during a read process for reading one or more data pages from the storage array 108. When one or more HEs in a page are detected, the decoder reads the whole stripe where the HE(s) has been detected from the storage array 108. The decoder 204 and the encoder 202 both have access to shared data (e.g., data to identify the type of encoding that was applied by the encoder 202 to the write pages to generate the write stripe). The read stripe contains parity bits that are removed by the decoder 204 to generate the read data pages. The decoder 204 includes a reconstructor 206 that is used when a read failure of at least one page has occurred. A read failure occurs, for example, when the error correcting capability of the internal ECC of a page has been exceeded. Typically, the locations of the pages in error are known and thus, the error locations (e.g., the erased page location(s)) and the read stripe are sent to the reconstructor 206, which attempts to retrieve the erased pages. The retrieval of the erased pages, including the process of correcting any errors in the erased pages (using, e.g., an erasure correcting code) is referred to herein as "reconstructing the erased pages."

Figure 3:
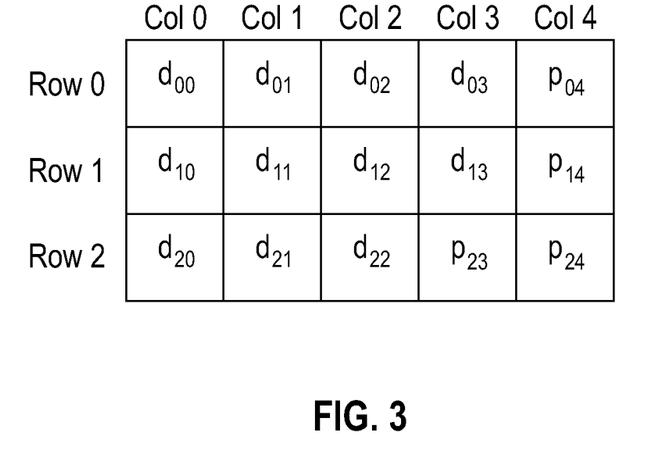
FIG. 3 illustrates contents of an encoded block in accordance with an embodiment.

FIG. 3 depicts contents of a portion of an array stored across a plurality of storage devices 106 (also referred to herein as a "stripe") that may be encoded by the encoder 202 using a multiple erasure correcting code. As used herein, the term "page" refers to a group of memory cells. In an embodiment a page is 4K bytes, however other page sizes may also be implemented by other embodiments. As used herein, the term "encoding stripe" refers to a group of pages that together make up a write stripe and that are encoded with the multiple erasure correcting code as a unit. As used herein, the term "decoding stripe" refers to a group of pages that together make up a read stripe and that are decoded with the multiple erasure correcting code as a unit.

The stripe depicted in FIG. 3 includes a block of pages arranged in three rows and five columns. In an embodiment, each column represents a portion of a storage device. In the stripe depicted in FIG. 3, each location represents a page in a flash memory device. As shown in FIG. 3, four pages are parity pages that contain parity bits (pages labeled $p_{04}$, $p_{14}$, $p_{24}$, and $p_{23}$) and the remaining pages are data pages that contain data bits (pages labeled $d_{00}$, $d_{10}$, $d_{20}$, $d_{01}$, $d_{11}$, $d_{21}$, $d_{02}$, $d_{12}$, $d_{22}$, $d_{03}$, and $d_{13}$). It is assumed that an ECC (e.g., BCH) or a CRC are used to detect that a page read failure has occurred and to identify any erasure locations. Embodiments described herein assume that a read failure has been reported, regardless of the method used to identify such read failure.

The arrangement of the data pages and the parity pages in the stripe of FIG. 3 allows recovery from any four page failures. The four parity pages are obtained using a four-erasure correcting code on the eleven data pages.

The placement of the parity pages may vary from correction stripe to correction stripe. Although the parity pages can be placed anywhere in the stripe, in general it is preferable to place them in different devices from stripe to stripe in order to avoid bottleneck effects. The stripe depicted in FIG. 3 is an illustration of an example stripe only as the number of rows and columns in a stripe can be arbitrary. In addition, the placement of the parity pages is arbitrary and they may be placed in other locations than those shown in FIG. 3. Further, the number of parity pages can vary depending on the recovery required. The stripe in FIG. 3 can be repeated indefinitely vertically, depending on the size of the storage devices. For example, if the storage devices are 32 G flash devices and the number of rows is equal to sixteen, then the encoding stripe is repeated 500,000 times.

In an embodiment, the decoder 204 receives a read stripe that has experienced page HEs from the storage array 108 that has been encoded in the manner shown in FIG. 3. As an example, it is assumed that the second storage device corresponding to pages $d_{01}$, $d_{11}$, and $d_{21}$ has suffered a catastrophic failure and that an additional HE has occurred in page $d_{13}$. These four page erasures can be recovered using the stripe configuration illustrated in FIG. 3 along with a four erasure error correcting code. In an embodiment, the recovery is performed by the reconstructor 206 located in the decoder 204.

Figure 4:
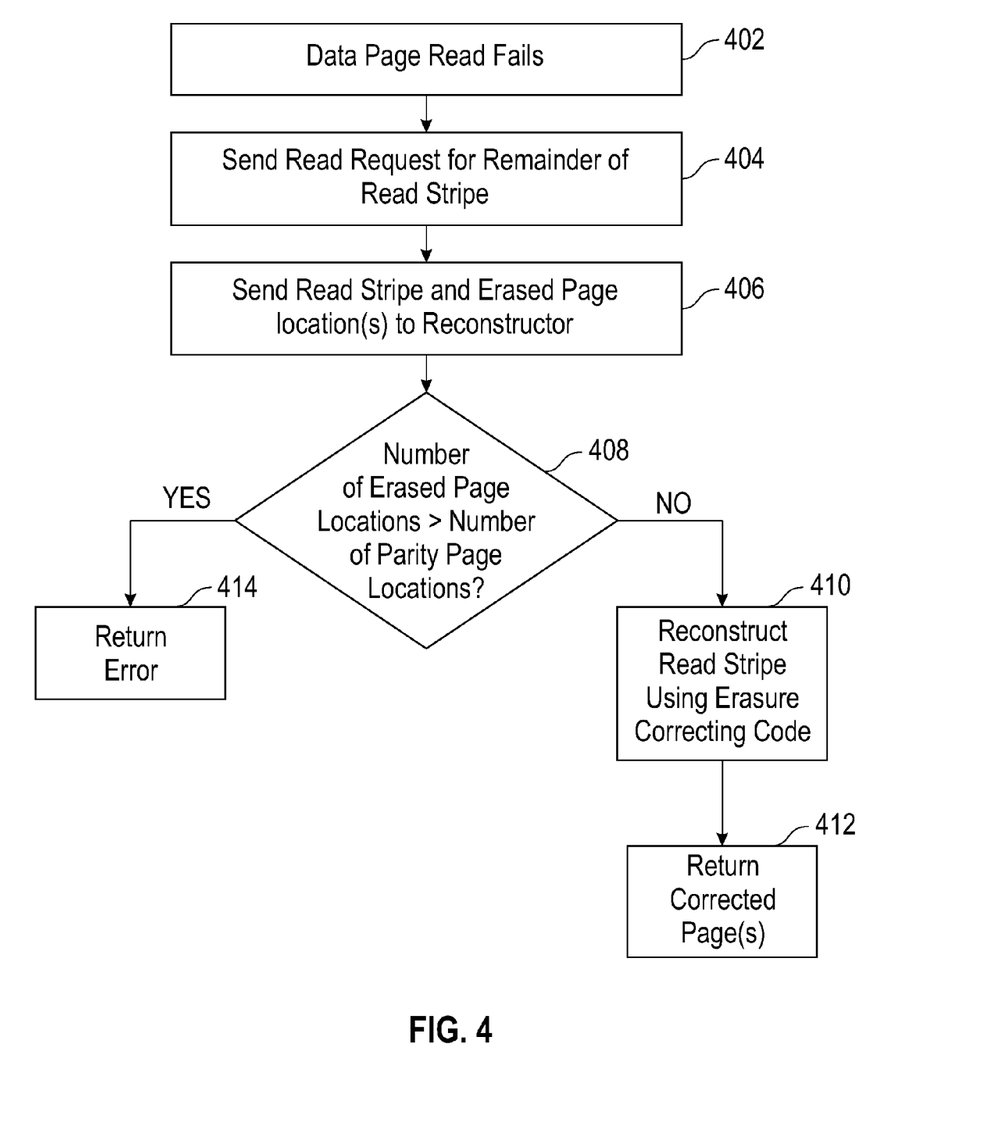
FIG. 4 is a process flow for erasure correction in accordance with an embodiment.

FIG. 4 depicts a process flow implemented by the decoder 204 in accordance with an embodiment. At block 402, the ECC and/or the CRC detect that a page read has failed. At block 404, a request is sent to read all the pages in the stripe that contains the page where the read page has failed. At block 406, the read stripe together with the location(s) of the page(s) where the read has failed (i.e., the erased page location(s)) are sent to the reconstructor 206. At block 408, it is determined if the number of erased page locations in the read stripe is greater than the number of parity page locations in the read stripe. If it is determined at block 408, that the number of erased page locations in the read stripe is greater than the number of parity page locations in the read stripe, then block 414 is performed to return an error condition to the decoder 204. In an embodiment, along with returning the error condition, the reconstructor 206 also requests that parity pages be evenly distributed among the N different storages devices 106. If it is determined at block 408, that the number of erased page locations is less than or equal to the number of parity page locations, then block 410 is performed. At block 410, the read stripe is reconstructed using a known erasure correcting code, such as a RS or BR93 code. At block 412, the reconstructor 206 outputs the recovered read stripe including the recovered read page to the decoder 204.

Technical effects and benefits include the ability to provide the same protection as a redundant array of independent disks RAID 6, but with storage efficiency approaching that of RAID 5. Thus, an embodiment may be utilized to maximize the protection against stripe failures for a given amount of redundancy.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Further, as will be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A method for correcting erasures in a storage array, the method comprising:
    receiving a read stripe from a plurality of storage devices, the read stripe comprising a block of pages arranged in rows and columns with each column corresponding to one of the storage devices, the pages comprising data pages and parity pages and wherein at least one of the columns or one of the rows contains only parity pages such that the number of parity pages are greater than a total number of rows, and the number of parity pages are less than twice of the number of rows and all the rows contain at least one parity page;
    determining whether the read stripe comprises at least one erased page and whether the number of erased pages is less than or equal to the number of parity pages; and
    reconstructing the at least one erased page in response to determining that the read stripe comprises at least one erased page and that the number of erased pages is less than or equal to the number of parity pages, the reconstructing responsive to a multiple erasure correcting code and to the block of pages caused by detection of at least one error, and the reconstructing also resulting in a recovered read stripe.

2. The method of claim 1, wherein the number of parity pages in at least one particular column is greater than the number of data pages in that particular column and that particular column includes both data pages and parity pages; and wherein the number of parity pages in the particular column exceeds the number of parity pages in a previous column.

3. The method of claim 1, wherein the number of erased pages is equal to the number of parity pages and one of the columns contains only erased pages indicating a storage device failure and one of the other columns contains an erased page indicating a hard error.

4. The method of claim 1, wherein the number of parity pages is two more than the number of rows.

5. The method of claim 1, wherein the multiple erasure correcting code is a maximum distance separable code.

6. The method of claim 1, wherein the multiple erasure correcting code is one of a Reed-Solomon code, a Blaum-Roth 93 code, a generalized EVENODD code, and a generalized row diagonal code.

7. The method of claim 1, wherein the storage devices are one of hard disk drives and flash devices.

8. A system for correcting erasures in a storage array, the system comprising:
    a storage array comprising a plurality of storage devices; and
    an array controller configured for:
        receiving a read stripe from the storage devices, the read stripe comprising a block of pages arranged in rows and columns with each column corresponding to one of the storage devices, the pages comprising data pages and parity pages, wherein the number of parity pages is greater than a total number of rows, and the number of parity pages multiplies less than twice of the number of rows, wherein the number of parity pages in at least one particular column is greater than the number of data pages in that particular column and that particular column includes both data pages and parity pages; and wherein the number of parity pages in the particular column exceeds the number of parity pages in a previous column;

determining whether the read stripe comprises at least one erased page pertaining to an error and whether the number of erased pages is less than or equal to the number of parity pages and wherein at least one of the columns or one of the rows contains only parity pages; and reconstructing the at least one erased page in response to determining that the read stripe comprises at least one erased page and that the number of erased pages is less than or equal to the number of parity pages, the reconstructing responsive to a multiple erasure correcting code and to the block of pages, and the reconstructing resulting in a recovered read stripe.

9. The system of claim 8, wherein the number of erased pages is equal to the number of parity pages.

10. The system of claim 9, wherein one of the columns contains only erased pages indicating a storage device failure and one of the other columns contains an erased page indicating a hard error.

11. The system of claim 9, wherein the number of parity pages is two or more than the number of rows.

12. The system of claim 11, wherein the storage devices are hard disk drives.

13. The system of claim 8, wherein the storage devices are flash devices.

14. A computer program product for correcting erasures in a storage array, the computer program product comprising:
a computer readable storage medium having computer readable program code embodied therewith, executable by a processor to:
receive a read stripe from a plurality of storage devices, the read stripe comprising a block of pages arranged in rows and columns with each column corresponding to one of the storage devices, the pages comprising data pages and parity pages and wherein at least one of the columns or one of the rows contains only parity pages such that the number of parity pages are greater than a total number of rows, and the number of parity pages are less than twice the number of rows and wherein all the rows contain at least one parity page;
determine whether the read stripe comprises at least one erased page and whether the number of erased pages is less than or equal to the number of parity pages; and
reconstruct reconstructing the at least one erased page in response to determining that the read stripe comprises at least one erased page and that the number of erased pages is less than or equal to the number of parity pages, the reconstructing responsive to a multiple erasure correcting code and to the block of pages caused by detection of at least one error, and the reconstructing resulting in a recovered read stripe.

15. The computer program product of claim 14, wherein one of the columns contains only erased pages indicating a storage device failure and one of the other columns contains an erased page indicating a hard error.

16. The computer program product of claim 14, wherein the number of parity pages is one or two more than the number of rows.

* * * * *